(12) United States Patent
Miyazaki et al.

(10) Patent No.: US 10,573,769 B2
(45) Date of Patent: Feb. 25, 2020

(54) BACKSIDE-ILLUMINATED ENERGY RAY DETECTION ELEMENT

(71) Applicant: HAMAMATSU PHOTONICS K.K., Hamamatsu-shi, Shizuoka (JP)

(72) Inventors: Yasuhito Miyazaki, Hamamatsu (JP); Kentaro Maeta, Hamamatsu (JP); Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 139 days.

(21) Appl. No.: 14/766,778

(22) PCT Filed: Jan. 24, 2014

(86) PCT No.: PCT/JP2014/051533
§ 371 (c)(1),
(2) Date: Aug. 10, 2015

(87) PCT Pub. No.: WO2014/125904
PCT Pub. Date: Aug. 21, 2014

(65) Prior Publication Data
US 2015/0380580 A1    Dec. 31, 2015

(30) Foreign Application Priority Data
Feb. 13, 2013    (JP) .................. 2013-025798

(51) Int. Cl.
*H01L 31/10*     (2006.01)
*H01L 31/0352*  (2006.01)

(52) U.S. Cl.
CPC .......... *H01L 31/0352* (2013.01); *H01L 31/10* (2013.01)

(58) Field of Classification Search
IPC ........ H01L 27/1462,27/1464, 31/10, 27/14831, 31/0352, 27/14812, 27/1463
See application file for complete search history.

(56) References Cited

U.S. PATENT DOCUMENTS

| 4,894,703 A | 1/1990 | Hamamsy et al. |
| 6,204,506 B1 | 3/2001 | Akahori et al. |
| (Continued) | | |

FOREIGN PATENT DOCUMENTS

| CN | 1714454 | 12/2005 | |
| EP | 1569275 A1 * | 8/2005 | ....... H01L 27/14603 |
| (Continued) | | | |

OTHER PUBLICATIONS

Machine English Translation of JPWO2004047178.*
English Translation of Bibliographic Data of JPWO2004047178.*

*Primary Examiner* — Hrayr A Sayadian
(74) *Attorney, Agent, or Firm* — Drinker Biddle & Reath LLP

(57) ABSTRACT

A back-illuminated energy ray detecting element 1 includes a semiconductor substrate and a protective film. The semiconductor substrate has a first principal surface as an energy ray incident surface and a second principal surface opposite to the first principal surface, and a charge generating region configured to generate an electric charge according to incidence of an energy ray is disposed on the second principal surface side. The protective film is disposed on the second principal surface side of the semiconductor substrate to cover at least the charge generating region, and includes silicon nitride or silicon nitride oxide. The protective film has a stress alleviating section configured to alleviate stress generated in the protective film.

12 Claims, 17 Drawing Sheets

(56) References Cited

U.S. PATENT DOCUMENTS

| | | |
|---|---|---|
| 2006/0061674 A1 | 3/2006 | Iida et al. |
| 2010/0214457 A1 | 8/2010 | Sakai |
| 2012/0034730 A1 | 2/2012 | Tu et al. |

FOREIGN PATENT DOCUMENTS

| | | | |
|---|---|---|---|
| JP | H10-335624 A | | 12/1998 |
| JP | 2004-241743 A | | 8/2004 |
| JP | 2004-296827 | | 10/2004 |
| JP | 2006-073885 | | 3/2006 |
| JP | WO2004047178 | * | 3/2006 |
| JP | 2011-249461 | | 12/2011 |
| JP | 2012-023251 A | | 2/2012 |
| JP | 2012-099847 A | | 5/2012 |
| JP | 2012-109496 A | | 6/2012 |

* cited by examiner

BACKSIDE-ILLUMINATED ENERGY RAY DETECTION ELEMENT

TECHNICAL FIELD

The present invention relates to a back-illuminated energy ray detecting element.

BACKGROUND ART

There is a known back-illuminated energy ray detecting element including a semiconductor substrate having a first principal surface as an energy ray incident surface and a second principal surface opposite to the energy ray incident surface, and in which a charge generating region configured to generate an electric charge according to incidence of an energy ray is provided on the second principal surface side (for example, see Patent Literature 1).

CITATION LIST

Patent Literature

Patent Literature 1: Japanese Patent Application Laid-Open Publication No. 10-335624

SUMMARY OF INVENTION

Technical Problem

In the back-illuminated energy ray detecting element, a protective film including silicon nitride or silicon nitride oxide is disposed on the second principal surface of the semiconductor substrate. The protective film including the silicon nitride or silicon nitride oxide functions as a hydrogen-containing film or a hydrogen-supplying film configured to supply hydrogen to the semiconductor substrate in addition to physically protecting the element. The protective film can reduce an interface state of the semiconductor substrate by supplying hydrogen to the semiconductor substrate. For this reason, the protective film has an effect of reducing a dark current.

In the protective film including the silicon nitride or silicon nitride oxide, stress occurs upon formation of the protective film. In the back-illuminated energy ray detecting element, for the purpose of preventing reduction of resolution due to diffusion of the generated electric charge, and shortening a moving distance of the electric charge such that the electric charge can be rapidly read, in particular, the semiconductor substrate is thinned. For this reason, the back-illuminated energy ray detecting element is likely to receive a large influence of stress generated in the protective film in comparison with a front-illuminated energy ray detecting element in which the energy ray is incident from the second principal surface side. A white spot phenomenon is one of the influences caused by the stress of the protective film. The white spot phenomenon is a phenomenon in which a defective pixel caused by a dark current is displayed as a white spot on an image obtained according to the electric charge generated in the charge generating region.

It is an object of the present invention to provide a back-illuminated energy ray detecting element capable of alleviating stress generated in a protective film.

Solution to Problem

A back-illuminated energy ray detecting element according to an aspect of the present invention includes a semiconductor substrate having a first principal surface as an energy ray incident surface and a second principal surface opposite to the first principal surface, and in which a charge generating region configured to generate an electric charge according to incidence of an energy ray is provided on the second principal surface side, and a protective film provided on the second principal surface side to cover at least the charge generating region, and including silicon nitride or silicon nitride oxide. The protective film has a stress alleviating section configured to alleviate stress generated in the protective film.

In the back-illuminated energy ray detecting element according to the aspect of the present invention, the protective film including the silicon nitride or silicon nitride oxide is provided on the second principal surface side of the semiconductor substrate to cover at least the charge generating region. For this reason, it is possible for the protective film to reduce dark current and physically protect the element. Since the protective film has the stress alleviating section, stress generated in the protective film is alleviated. Accordingly, the back-illuminated energy ray detecting element capable of suppressing generation of an image defect such as a white spot phenomenon or the like can be realized.

The stress alleviating section may be a bottomed or bottomless recess recessed in a thickness direction of the protective film. When the stress alleviating section is the bottomed recess, a thickness of the protective film is small at a position of the recess. When the stress alleviating section is the bottomless recess, the protective film is not present at a position of the recess. Even in any case, stress generated in the protective film can be securely alleviated by a relatively simple configuration. In view of reducing the dark current and physically protection the stress alleviating section may be the bottomed recess.

The recess may be a groove extending in a direction parallel to the second principal surface. In this case, the stress generated in the protective film is alleviated at a position of the groove. Accordingly, when a place on which the stress is concentrated is determined, the groove is disposed at that place, and concentration of the stress generated in the protective film can be easily and securely alleviated.

The protective film may have the plurality of grooves extending in the same direction and serving as the stress alleviating section. In this case, the stress generated in the protective film can be further alleviated.

The charge generating region may have a plurality of energy ray sensitive regions juxtaposed in a first direction, the element may further include a charge transfer section disposed to face the charge generating region, and configured to transfer the electric charges generated in the energy ray sensitive regions in a second direction perpendicular to the first direction, the plurality of grooves extending in a direction parallel to the first direction. In this case, in the second direction, a stress alleviation effect due to the plurality of grooves is high. Since the plurality of grooves are in parallel to the direction in which the electric charges are transferred, i.e., the second direction, a variation in a reduction effect of the dark current between the plurality of energy ray sensitive regions is suppressed.

The charge generating region may have a plurality of energy ray sensitive regions juxtaposed in a first direction, the element may further include a charge transfer section disposed so as to be opposed to the charge generating region, and configured to transfer the electric charges generated in the energy ray sensitive regions in a second direction perpendicular to the first direction, the plurality of grooves extending in a direction along the second direction. In this case, in the first direction, a high stress alleviation effect due to the plurality of grooves is obtained.

The plurality of grooves may be disposed to correspond to a region between the two adjacent energy ray sensitive regions. In the semiconductor substrate, the dark current is not easily generated in the region between the two adjacent energy ray sensitive regions. As the plurality of grooves are disposed to correspond to the region between the two adjacent energy ray sensitive regions, stress generated in the protective film can be alleviated without impeding the reduction effect of the dark current.

The recess may be a lattice-shaped groove. In this case, in the direction in which the groove extends, a high stress alleviation effect is obtained.

The protective film may have a plurality of recesses disposed in a two-dimensional array that serve as the stress alleviating section. In this case, in the directions in which the plurality of recesses are arranged, a high stress alleviation effect is obtained.

The charge generating region may have a plurality of energy ray sensitive region juxtaposed in a first direction, the element may further include a charge transfer section disposed so as to be opposed to the charge generating region and configured to transfer the electric charges generated in the energy ray sensitive region in a second direction perpendicular to the first direction, the charge transfer section having a plurality of wirings extending in a direction crossing the first direction and the second direction, and disposed at intervals, and the plurality of grooves may be disposed on the plurality of wirings. In this case, since the plurality of wirings extend in the direction crossing the first direction and the second direction, the plurality of grooves extend in the direction crossing the first direction and the second direction. In the first direction and the second direction, a high stress alleviation effect is obtained due to the grooves. Since the plurality of grooves are disposed in parallel to the direction in which the electric charges are transferred, i.e., the second direction, a variation in a reduction effect of the dark current between the plurality of energy ray sensitive regions is suppressed.

In the element, the dark current is not generated in the region in which the wirings are disposed as easily as in the region between the two adjacent wirings. This is for the following reasons. In the region in which the wirings are disposed, hydrogen is likely to be trapped by the wiring. The hydrogen trapped in the region in which the wirings are disposed contributes to reduction of the dark current. Accordingly, when the plurality of grooves are disposed on the plurality of wirings, stress generated in the protective film can be alleviated without impeding the reduction effect of the dark current. Since the plurality of grooves are disposed on the plurality of wirings, reduction in a physical protection effect with respect to the wiring is undeniable. Since a width of the wiring is small, a width of the groove corresponding to the width of the wiring is also small. For this reason, the physical protection effect of the element in the entire protective film is not significantly decreased.

The charge generating region has a plurality of energy ray sensitive regions juxtaposed in a first direction, the element may further include a charge transfer section disposed so as to be opposed to the charge generating region and configured to transfer the electric charges generated in the energy ray sensitive regions in a second direction perpendicular to the first direction, the charge transfer section having a plurality of wirings extending in a direction crossing the first direction and the second direction, and disposed at intervals, and the plurality of grooves are disposed on a region between the two adjacent wirings. In this case, since the plurality of wirings extend in the direction crossing the first direction and the second direction, the plurality of grooves also extend in the direction crossing the first direction and the second direction. In the first direction and the second direction, a high stress alleviation effect is obtained. Since the plurality of grooves are disposed in parallel to the direction in which the electric charges are transferred, i.e., the second direction, a variation in a reduction effect of the dark current between the plurality of energy ray sensitive regions is suppressed. Since each of the grooves is disposed on the region between the two adjacent wirings, each of the wirings can be securely protected by the protective film, and short circuit or disconnection of the wiring can be prevented.

Advantageous Effects of Invention

According to the present invention, it is possible to provide the back-illuminated energy ray detecting element capable of alleviating stress generated in a protective film

DESCRIPTION OF EMBODIMENTS

The embodiments of the present invention will be described below in detail with reference to the drawings. In the description the same elements or elements with the same functionality will be denoted by the same reference signs, without redundant description.

(First Embodiment)

Figure 1:
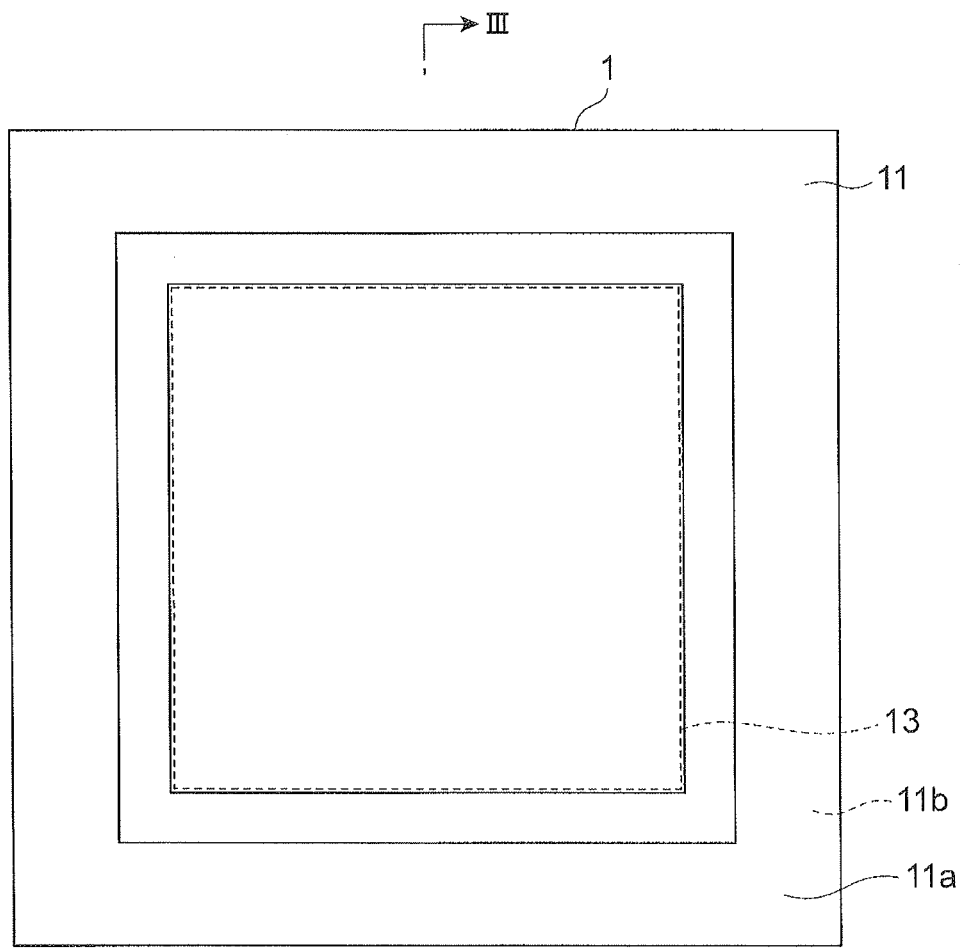
FIG. 1 is a view of a back-illuminated energy ray detecting element according to a first embodiment from a first principal surface side.
Figure 2:
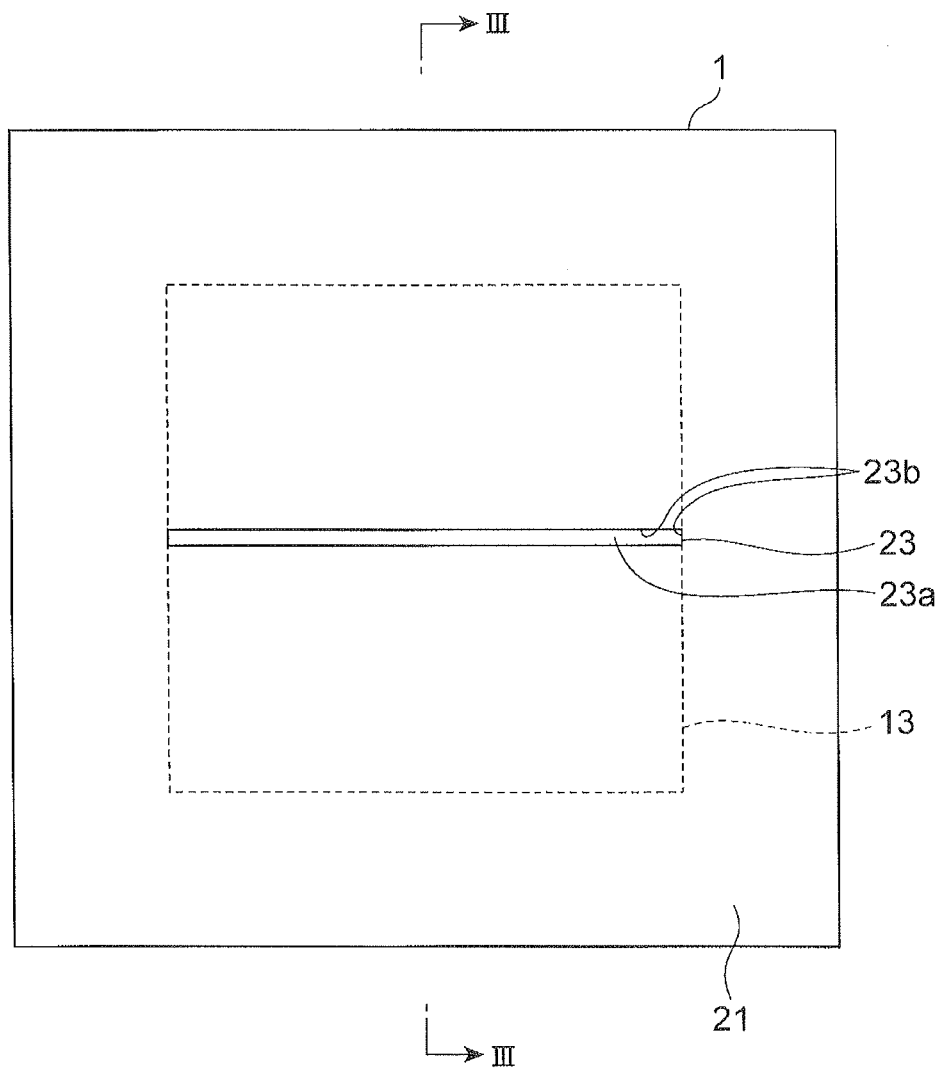
FIG. 2 is a view of a back-illuminated energy ray detecting element according to a second embodiment from a second principal surface side.
Figure 3:
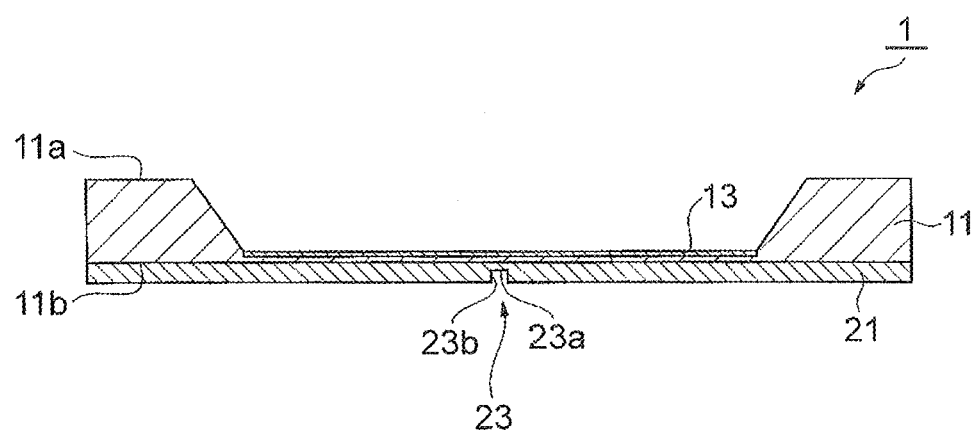
FIG. 3 is a view for explaining a cross-sectional configuration along line III-III shown in FIG. 1 and FIG. 2.
Figure 4:
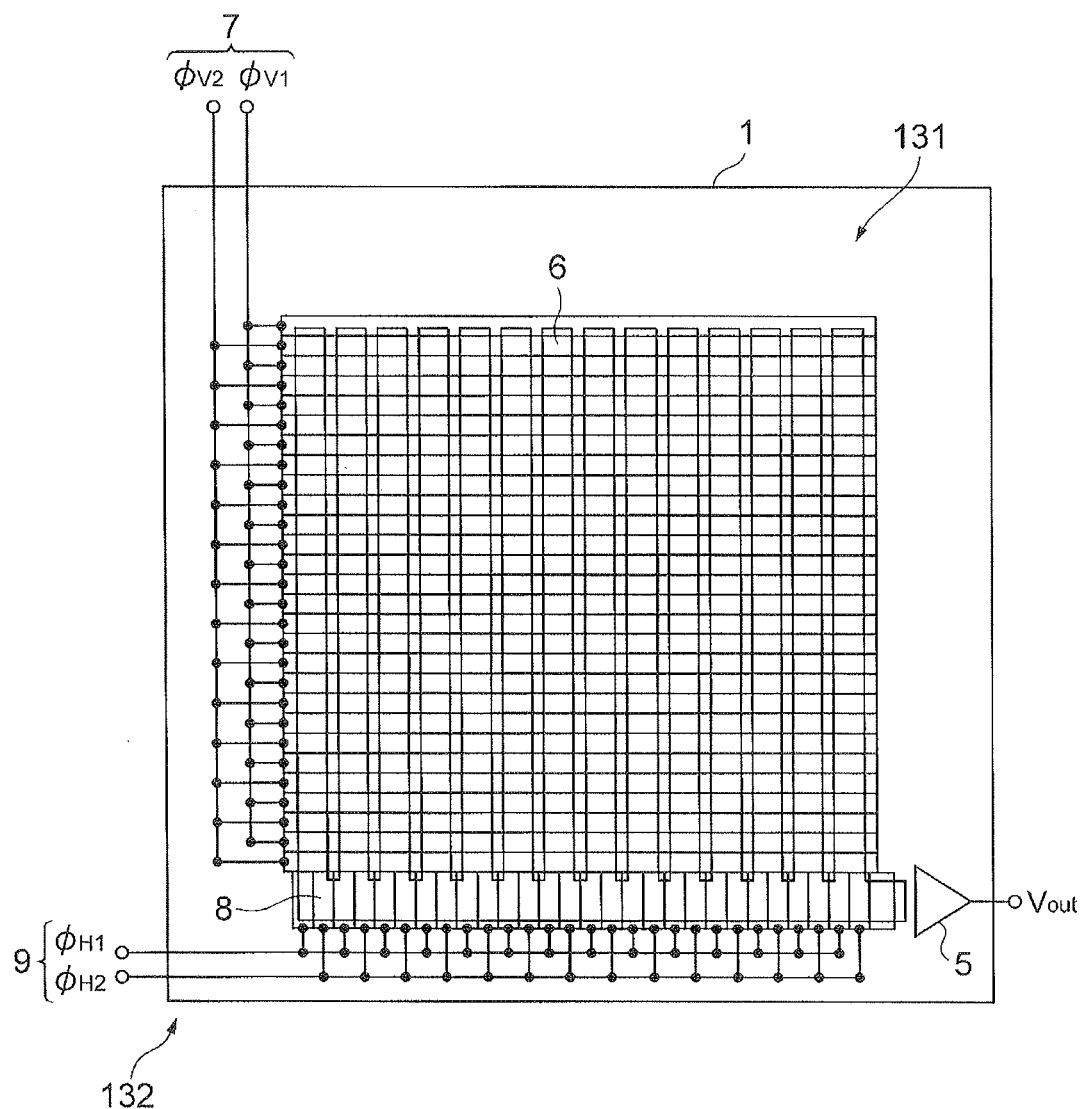
FIG. 4 is a view schematically showing a configuration of the back-illuminated energy ray detecting element according to the first embodiment.
Figure 5:
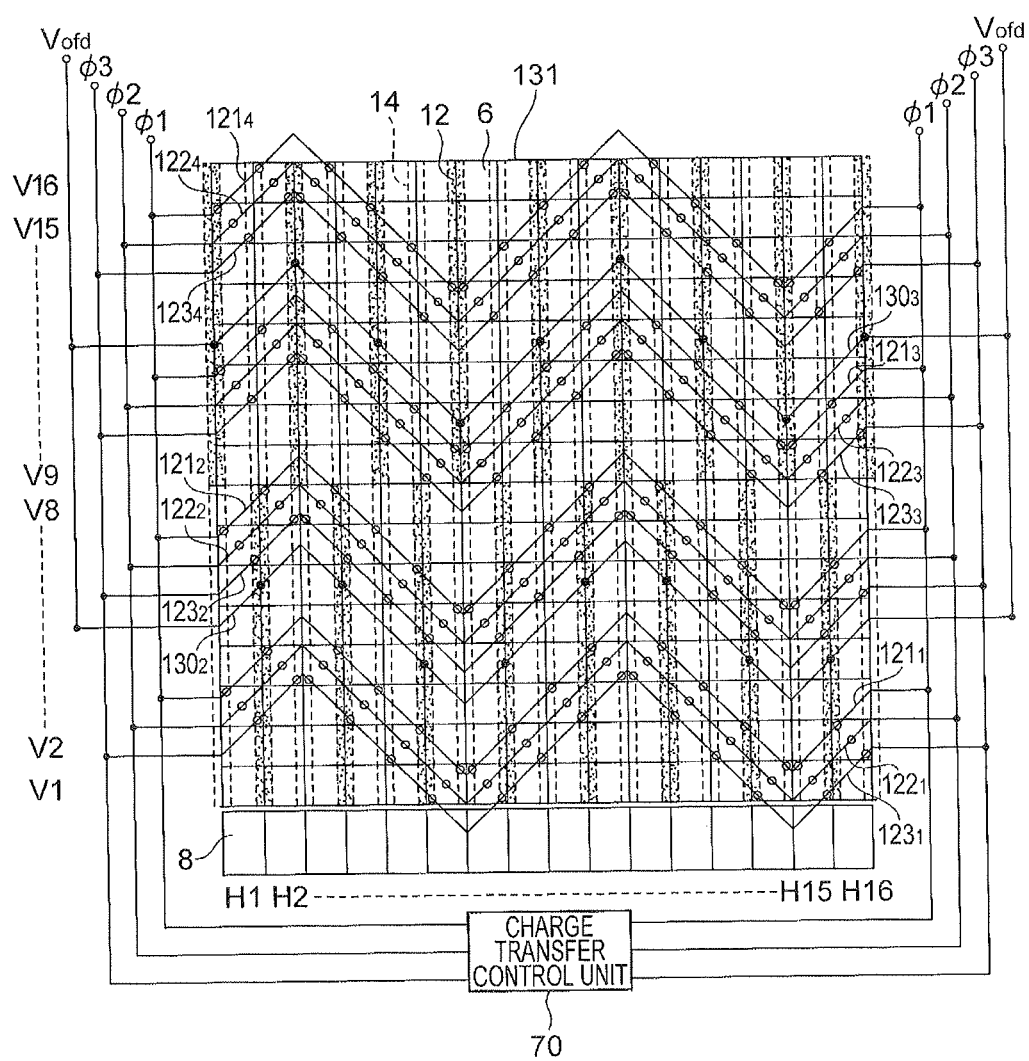
FIG. 5 is a configuration view showing an example of disposition of auxiliary wirings and charge discharging wirings.
Figure 6:
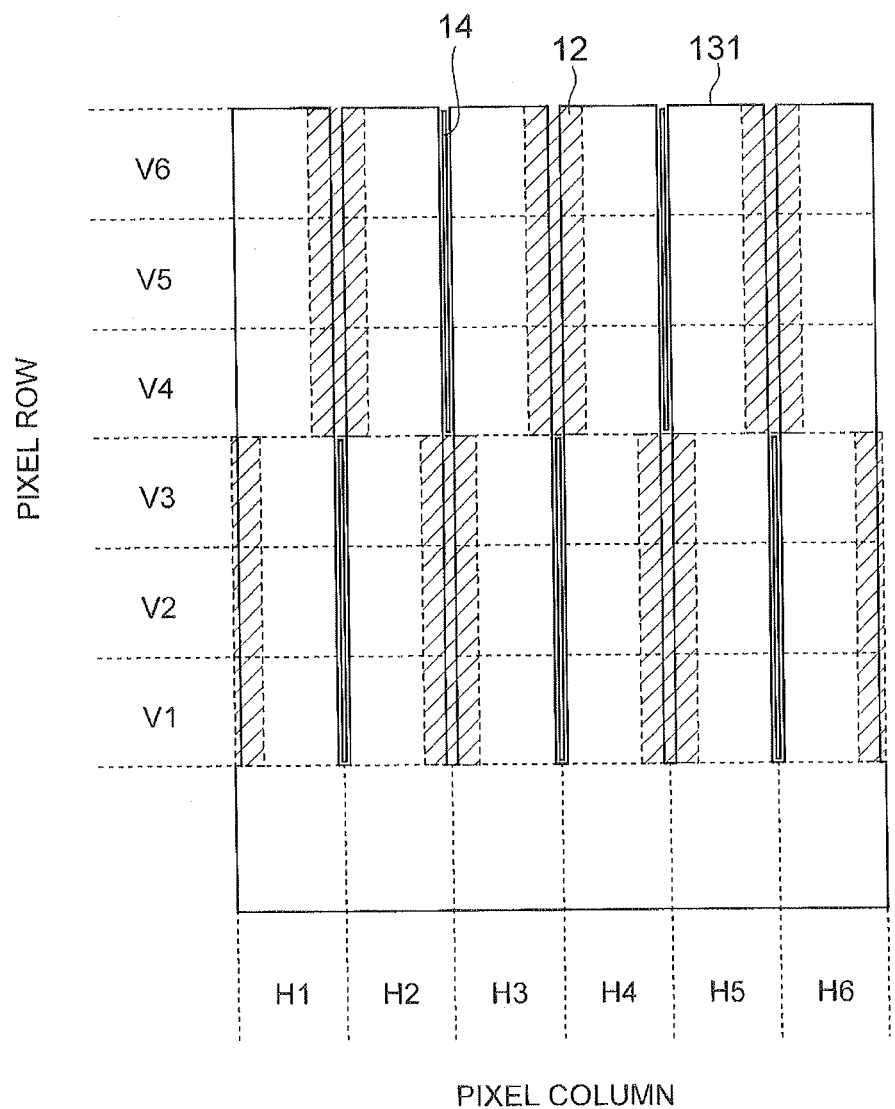
FIG. 6 is a configuration view showing an example of disposition of overflow drains and a pixel separating sections.

First, a configuration of a back-illuminated energy ray detecting element 1 according to a first embodiment will be described with reference to FIGS. 1 to 6. FIG. 1 is a view of the back-illuminated energy ray detecting element according to the first embodiment from a first principal surface side. FIG. 2 is a view of the back-illuminated energy ray detecting element according to the first embodiment from a second principal surface side. FIG. 3 is a view for explaining a cross-sectional configuration along line III-III shown in FIGS. 1 and 2. FIG. 4 is a view schematically showing the configuration of the back-illuminated energy ray detecting element according to the first embodiment. FIG. 5 is a configuration view showing an example of disposition of auxiliary wirings and charge discharging wirings. FIG. 6 is a configuration view showing an example of disposition of an overflow drains and a pixel separating sections.

As shown in FIGS. 1 and 3, the back-illuminated energy ray detecting element 1 includes a semiconductor substrate 11. The semiconductor substrate 11 is a substrate comprised of silicon. The semiconductor substrate 11 has a first principal surface 11a and a second principal surface 11b opposed to each other. The first principal surface 11a is an energy ray incident surface through which an energy ray enters. A charge generating region 13 configured to generate an electric charge according to the entering energy ray is disposed on the second principal surface 11b side of the semiconductor substrate 11.

As shown in FIG. 3, the semiconductor substrate 11 has a thin section. The thin section is formed by thinning a region opposite to the charge generating region 13 of the semiconductor substrate 11 from the first principal surface 11a side while maintaining a peripheral portion of the region. The semiconductor substrate 11 has a thick frame section disposed around the thin section. A thickness of the thin section is about some tens of μm A thickness of the frame section is about some hundreds of μm.

A configuration of the charge generating region 13 will be described with reference to FIGS. 4 and 5. The charge generating region 13 has energy ray sensitive regions 131. The energy ray sensitive regions 131 are regions in which an electric charge according to the incident intensity of the energy ray is generated in response to incidence of the energy ray. As the energy ray sensitive regions 131 are disposed in parallel to a first direction, the plurality of energy ray sensitive regions 131 are juxtaposed. Each of the energy ray sensitive regions 131 includes a photodiode. As the energy ray enters the photodiode of the energy ray sensitive region 131, an electric charge is generated due to a photoelectric effect.

Next, a charge transfer section 132 will be described. The back-illuminated energy ray detecting element 1 includes the charge transfer section 132. The charge transfer section 132 is disposed so as to be opposed to the charge generating region 13. The charge transfer section 132 transfers an electric charge generated in the energy ray sensitive region 131 in a second direction (a longitudinal direction of FIG. 4) perpendicular to a first direction (a lateral direction of FIG. 4).

In the embodiment, as a method of transferring the electric charge generated in the charge generating region 13, an example of a full-frame transfer (FFT) CCD will be described. In this case, the FFT-CCD is disposed so as to be opposed to the charge generating region 13. The method of transferring the electric charge is not limited to the FFT-CCD. FIG. 4 shows only a transfer electrode in the electrode, wiring, or the like configured to transfer the electric charge in order to describe transfer of the electric charge. In FIG. 4, the auxiliary wiring and the charge discharging wiring are not shown.

A plurality of vertical transfer channels 6 are arranged in the charge transfer section 132. The vertical transfer channel 6 transfers the electric charge generated in the energy ray sensitive region 131 in the second direction. A vertical transfer electrode group 7 constituted by a plurality of vertical transfer electrodes comprised of polycrystalline silicon is formed in the first direction perpendicular to the vertical transfer channel 6 as a longitudinal direction. A vertical shift register is constituted by the vertical transfer channel 6 and the vertical transfer electrode group 7.

In the vertical transfer electrode group 7, a transfer voltage is applied to each of the plurality of transfer electrodes. The plurality of transfer electrodes are disposed at positions opposite to the charge generating region 13 in a plurality of arrays. In the embodiment, the transfer electrodes to which transfer voltages $\varphi v1$ and $\varphi v2$ having two different phases are applied are combined as sets to be arranged at positions opposite to the energy ray sensitive region 131 in the first direction. Here, while the number of phases of the transfer voltages is two for the purpose of description, the number of phases is not limited thereto. Accordingly, transfer of the electric charge in the second direction is performed.

The arranged vertical transfer channels 6 are connected to horizontal transfer channels 8. A horizontal transfer electrode group 9 constituted by a plurality of horizontal transfer electrodes is formed perpendicular to the vertical transfer channel 6. A horizontal shift register is constituted by the horizontal transfer channel 8 and the horizontal transfer electrode group 9.

In the horizontal transfer electrode group 9, a transfer voltage is applied to each of a plurality of horizontal transfer electrodes. The plurality of horizontal transfer electrodes are disposed at positions opposite to the charge generating region 13 in a plurality of arrays. In the embodiment, the transfer electrodes to which transfer voltages $\varphi H1$ and $\varphi H2$ having two different phases are applied are combined as sets to be arranged at positions opposite to the energy ray sensitive region 131 in the second direction. Here, the number of phases of the transfer voltage is two for the purpose of description. The number of phases of the transfer voltages is not limited thereto, transfer of the electric charge in the first direction is performed by the plurality of horizontal transfer electrodes.

Next, specific examples of configurations of electrodes and wirings of the vertical shift register constituted by the vertical transfer channel 6 and the vertical transfer electrode group 7 will be described with reference to FIG. 5. Here, configurations of the horizontal transfer channel 8 of the horizontal shift register, the horizontal transfer electrode group 9, a charge reading unit 5 attached thereto, and so on, are the same as shown in FIG. 4, and illustration and description thereof will be omitted below.

An electric charge is transferred by the vertical shift register constituted by the vertical transfer channel 6 and the vertical transfer electrode group 7, and the horizontal shift register constituted by the horizontal transfer channel 8 and the horizontal transfer electrode group 9. The electric charge is transferred to the charge reading unit 5. The transfer of the electric charge is controlled by a charge transfer control unit 70. The charge reading unit 5 is a charge amplifier or the like, and the charge reading unit 5 converts the electric charge into a voltage. The electric charge is read as a time-series signal by the charge reading unit 5.

FIG. 5 shows a lattice type two-dimensional pixel array divided by the vertical transfer channel 6 and the vertical transfer electrode group 7 for the purpose of description. FIG. 5 shows the energy ray sensitive regions 131 divided by solid lines. The configured two-dimensional pixel array may have, for example, about 20 μm×20 μm pixels, which are two dimensionally arranged in 512 columns, 1024 columns or 2048 columns in the first direction and 128 rows, 256 rows or 512 rows in the second direction. Each pixel corresponds to the photodiode of the energy ray sensitive region 131. In the electrode and wiring, illustration of each of the vertical transfer electrodes of the vertical transfer electrode group 7 disposed at an upper section of the energy ray sensitive region 131 will be omitted. Each of the wirings of the auxiliary wirings 121$n$ to 123$n$ (n is a positive integer) and the charge discharging wirings 130$n$ (n is a positive integer) disposed at the upper portion of the vertical transfer electrodes is schematically shown by a wiring pattern thereof. FIG. 5 shows the auxiliary wirings 121$n$ to 123$n$ (n is 1 to 4) and the charge discharging wirings 130$n$ (n is 2 or 3).

The energy ray sensitive region 131 is divided into a plurality of columns in the first direction by the plurality of vertical transfer channels 6 extending in the second. direction. FIG. 5 shows sixteen pixel columns H1 to H16 as an example.

The back-illuminated energy ray detecting element 1 shown in FIG. 5 is configured as a 3-phase driving type in which charge transfer in the second direction is performed by transfer voltages φ1 to φ3 having three phases. Here, for the purpose of description, the number of phases of the transfer voltage is three. The number of phases of the transfer voltage is not limited thereto. The energy ray sensitive region 131 is divided into a plurality of rows in the second direction by the vertical transfer electrode group 7 constituted by assembling three vertical transfer electrodes to which the transfer voltages φ1 to φ3 having three phases are applied. In FIG. 5, sixteen pixel rows V1 to V16 are shown as an example.

The energy ray sensitive region 131 is configured to have 16×16 pixels, which are two-dimensionally arranged in the pixel columns H1 to H16 divided in the first direction and the pixel rows V1 to V16 divided in the second direction.

The charge transfer section 132 includes wirings of the auxiliary wirings 121$n$ to 123$n$ and the charge discharging wirings 130$n$. The auxiliary wirings 121$n$ to 123$n$ and the charge discharging wirings 130$n$ may be comprised of, for example, a material having a lower resistance than polycrystalline silicon used for the vertical transfer electrode. As the material having a lower resistance than the polycrystalline silicon, a metal such as aluminum (Al) or the like or a metal silicide may be provided.

The auxiliary wirings 121$n$ to 123$n$ subsidiarily supply the transfer voltages φ1 to φ3 having three phases to the respective vertical transfer electrodes. The auxiliary wirings 121$n$ to 123$n$ are electrically connected to the plurality of vertical transfer electrodes. In FIG. 5, positions of contact points between the auxiliary wirings 121$n$ to 123$n$ and the vertical transfer electrodes are shown by white circles on auxiliary wirings.

The auxiliary wirings are formed in a shape extending in substantially the first direction in a wiring pattern by assembling the three the auxiliary wirings 121$n$ to 123$n$ corresponding to the transfer voltages φ1 to φ3 having three phases as one set. The transfer voltages φ1 to φ3 are supplied to the auxiliary wirings 121$n$ to 123$n$ from left and right end sections thereof. As the auxiliary wirings 121$n$ to 123$n$ corresponding to the transfer voltages φ1 to φ3 having three phases are configured as one set of wiring patterns, the transfer voltages are efficiently supplied to the vertical transfer electrodes.

Excessive charge discharging regions 12 are formed at predetermined one sides in the second direction with respect to the energy ray sensitive regions 131. Accordingly, the excessive electric charges generated in the energy ray sensitive region 131 are collected in the excessive charge discharging region 12.

As shown in FIG. 5, the excessive charge discharging regions 12 are formed to continue along sides in the second direction at boundary regions of the two pixel columns H1 and H2, the two pixel columns H3 and H4, the two pixel columns H5 and H6, the two pixel columns H7 and H8, the two pixel columns H9 and H10, the two pixel columns H11 and H12, the two pixel columns H13 and H14, and the two pixel columns H15 and H16 with respect to 16×8 pixels included in eight pixel rows V1 to V8 of a lower side.

The excessive charge discharging regions 12 are formed to continue along sides in the second direction between boundary regions of the two pixel columns H2 and H3, the two pixel columns H4 and H5, the two pixel columns H6 and H7, the two pixel columns H8 and H9, the two pixel columns H10 and H11, the two pixel columns H12 and H13, and the two pixel columns H14 and H15, a left region of the pixel column H1, and a right region of the pixel column H16 with respect to 16×8 pixels included in eight pixel rows V9 to V16 of an upper side.

The electric charges collected in the excessive charge discharging region 12 are discharged by the charge discharging wiring 130$n$ configured to discharge the excessive electric charges. The charge discharging wiring 130$n$ is disposed at the charge transfer section 132. The excessive electric charges generated from the energy ray sensitive region 131 can be efficiently discharged from a terminal $V_{ofd}$ by the charge discharging wiring 130$n$.

Accordingly, even when the electric charges generated in the energy ray sensitive region 131 exceed an accumulation capacity of the energy ray sensitive region 131, inconvenience such as blooming or the like leaking to another energy ray sensitive region 131 is prevented by the excessive charge discharging region 12. For example, an overflow drain may be formed as the excessive charge discharging region 12.

The excessive charge discharging region 12 may be formed such that the number of pixels in which the excessive charge discharging region 12 is formed at one side in the second direction is substantially equal to the number of pixels in which the excessive charge discharging region 12 is formed at the other side in the second direction with respect to each pixel included in the pixel column in the second direction in the energy ray sensitive region 131.

For example, as a method of imaging a substance moving at a certain speed, such as a substance on a belt conveyor or the like, there is a TDI (time delay and integration) driving method of accumulating electric charges while transferring the electric charges accumulated in the charge generating region at a speed corresponding to a moving speed of the substance. In the TDI driving method, an insensitive region can be appropriately supplemented by the excessive charge discharging region 12 when the number of pixels in which the excessive charge discharging region 12 is formed at one side or the other side of the pixel column is substantially equal in each of the pixel columns.

As shown in FIGS. 5 and 6, pixel separating sections 14 are formed at the predetermined other sides in the second direction with respect to the energy ray sensitive region 131. As shown in FIG. 6, the back-illuminated energy ray detecting element 1 has the pixel separating sections 14. The pixel separating sections 14 separate pixels. The pixel separating sections 14 are an oxide film ($SiO_2$) formed by, for example, LOCOS (local oxidation of silicon).

As shown in FIG. 5, the pixel separating sections 14 are formed to continue along sides in the second direction at boundary regions of the two pixel columns H2 and H3, the two pixel columns H4 and H5, the two pixel columns H6 and H7, the two pixel columns H8 and H9, the two pixel columns H10 and H11, the two pixel columns H12 and H13, and the two pixel columns H14 and H15 with respect to 16×8 pixels included in eight pixel rows V1 to V8 of a lower side.

The pixel separating sections 14 are formed to continue along sides in the second direction at boundary regions of the two pixel columns H1 and H2, the two pixel columns H3 and H4, the two pixel columns H5 and H6, the two pixel columns H7 and H8, the two pixel columns H9 and H10, the two pixel columns H11 and H12, the two pixel columns H13 and H14, and the two pixel columns H15 and H16 with respect to 16×8 pixels included in eighth pixel rows V9 to V16 of an upper side. The pixel separating sections 14 may be formed at a left region in the second direction of the pixel column H1 and a right region in the second direction of the pixel column H16.

As shown in FIG. 2, a protective film 21 is provided on the second principal surface 11b side of the semiconductor substrate 11 to cover at least the charge generating region 13. In the embodiment, as shown in FIGS. 2 and 3, the protective film 21 is provided to cover the entire second principal surface 11b side of the semiconductor substrate 11. The protective film 21 is formed of a member including silicon nitride or silicon nitride oxide. A thickness of the protective film 21 is about several pm. The protective film 21 may be formed by, for example a plasma CVD (chemical vapor deposition) method.

As shown in FIGS. 2 and 3, the protective film 21 has a groove 23 recessed in a thickness direction. In the embodiment, the case in which the groove 23 functions as a stress alleviating section will be described. The protective film 21 has a bottom surface 23a in a direction substantially perpendicular to the thickness direction of the protective film 21. The protective film 21 has inner surfaces 23b in a direction substantially parallel to the thickness direction of the protective film 21. The groove 23 is formed in the protective film 21 by the bottom surface 23a and the inner surfaces 23b.

A thickness between a surface opposite to a surface of the protective film 21 in contact with the second principal surface 11b and the second principal surface 11b is referred to as a first thickness. A thickness between the second principal surface 11b and the bottom surface 23a is referred to as a second thickness. The first thickness is larger than the second thickness. The second thickness may not be uniform from one end to the other end in a range corresponding to the charge generating region 13.

A cross section in a direction perpendicular to a direction in which the groove 23 of the protective film 21 extends has a rectangular shape constituted by the bottom surface 23a and the inner surfaces 23b. A cross-sectional shape in a direction perpendicular to a direction in which the groove 23 of the protective film 21 extends is not limited to the rectangular shape but may be, for example, a polygonal shape or a circular shape.

In the first embodiment, as shown in FIG. 2, the groove 23 is positioned in the first direction. One end and the other end of the groove 23 are disposed in a region opposite to the charge generating region 13. The groove 23 is disposed at substantially a center in the second direction. The groove 23 extends in a direction parallel to the second principal surface 11b.

Stress is considered to be concentrated on substantially a center of the protective film 21. As the groove 23 is positioned at substantially a center of the protective film 21, the stress concentrated on substantially the center of the protective film 21 is alleviated.

The stress is considered to be concentrated on a region facing the region in which the end of the excessive charge discharging region 12 is opposite to the end of the pixel separating section 14 in the protective film 21. As the groove 23 is positioned so as to be opposed to the region in which the end of the excessive charge discharging region 12 is opposite to the end of the pixel separating section 14, the stress concentrated on the protective film 21 is alleviated.

In the embodiment, the region in which the end of the excessive charge discharging region 12 is opposite to the end of the pixel separating section 14 is positioned so as to be opposed to substantially the center of the protective film 21. As the groove 23 is positioned at substantially the center of the protective film 21 and extends in the direction along the pixel row of the pixel array of the charge generating region 13, the stress concentrated on the protective film 21 is easily and securely alleviated.

For example, when the number of pixels is the above-mentioned 16×16 pixels, the stress is considered to be concentrated on a position opposite to the region between the pixel row V8 and the pixel row V9 in the protective film. As the groove 23 is positioned at the protective film 21 to be opposed to the region between the pixel rows V8 and V9, the stress concentrated on the protective film 21 is easily and securely alleviated.

When a place on which the stress generated in the protective film 21 is concentrated is determined, as the groove 23 is positioned at the region to which the stress is concentrated, stress of the protective film 21 can be easily and securely alleviated.

The protective film 21 according to the first embodiment described above can achieve reduction of a dark current and physical protection, and the stress generated in the protective film 21 can be alleviated by the groove 23.

(Second Embodiment)

A back-illuminated energy ray detecting element according to a second embodiment will be described with reference to FIGS. 8 and 9. The back-illuminated energy ray detecting element 1 according to the second embodiment is the same as the back-illuminated energy ray detecting element 1 according to the first embodiment except for the protective film 21. Hereinafter, overlapping description with the first embodiment will be omitted, and the second embodiment will be described focusing on differences.

Figure 8:
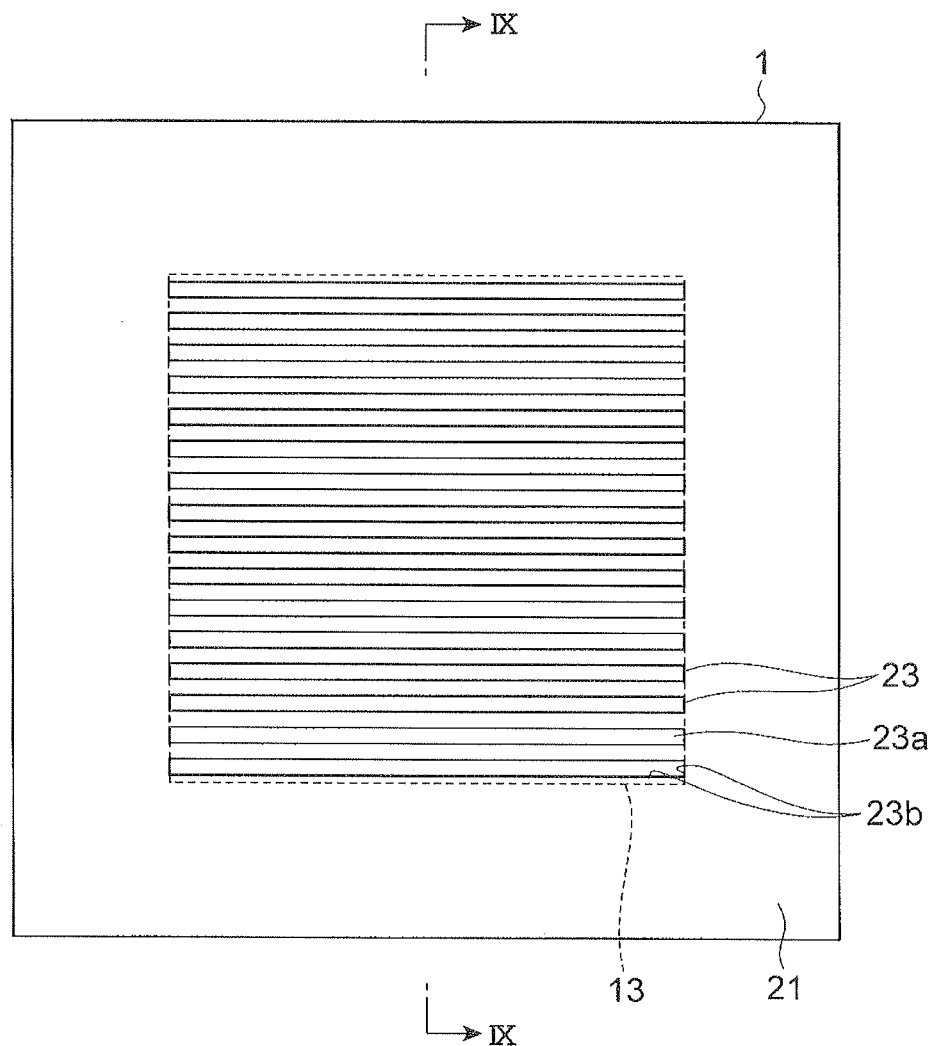
FIG. 8 is a view of a back-illuminated energy ray detecting element according to a modification example of the second embodiment from a second principal surface side.

FIG. 8 is a view of the back-illuminated energy ray detecting element according to the second embodiment from the second principal surface 1 lb side. FIG. 9 is a view for explaining a cross-sectional configuration along line IX-IX shown in FIG. 8.

Figure 9:
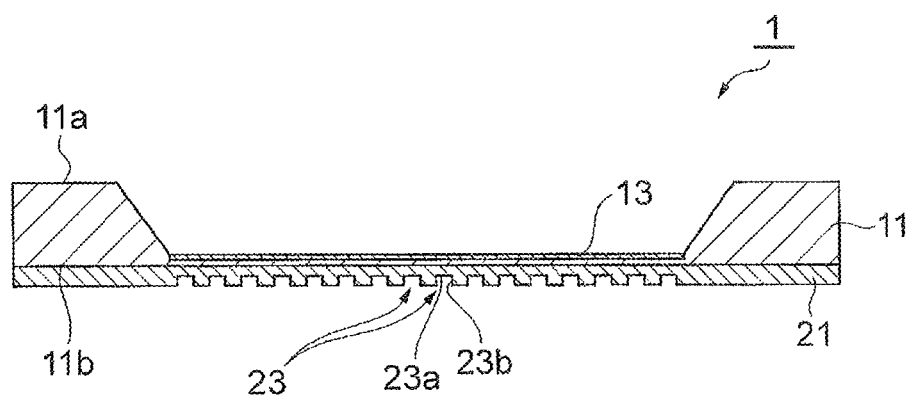
FIG. 9 is a view for explaining a cross-sectional configuration along line IX-IX shown in FIG. 8.

As shown in FIGS. 8 and 9, the protective film 21 has a plurality of grooves 23 extending in the same direction. The protective film 21 has the plurality of grooves 23 formed at positions opposite to the charge generating region 13. The protective film 21 periodically has a first thickness and a second thickness. When the protective film 21 periodically has the first thickness and the second thickness, an interval between the first thickness and the second thickness may be repeated at the same interval or may be repeated at different intervals.

In the second embodiment, as shown in FIG. 9, the protective film 21 has the plurality of grooves 23 extending in the first direction. The plurality of grooves 23 extend in a direction parallel to the pixel row of the pixel array. For this reason, an effect of alleviating the stress from the plurality of grooves 23 in the second direction is obtained. Since the plurality of grooves 23 are parallel to the direction in which the electric charges are transferred, a variation in the reduction effect of the dark current between the plurality of energy ray sensitive regions 131 is suppressed. Accordingly, as the protective film 21 has the plurality of grooves 23 extending in the first direction, the stress of the protective film 21 is alleviated more easily and securely.

The protective film 21 according to the second embodiment described above can achieve reduction of the dark current and physical protection, and the stress generated in the protective film 21 can be further alleviated by the plurality of grooves 23.

A configuration of the protective film 21 in the embodiment may be employed in a semiconductor element using a imaging method such as a TDI driving method or the like in which the electric charges are transferred and the transferred electric charges are accumulated.

(Third Embodiment)

A back-illuminated energy ray detecting element according to a third embodiment will be described with reference to FIG. 10. The back-illuminated energy ray detecting element 1 according to the third embodiment is the same as the back-illuminated energy ray detecting element 1 according to the first embodiment except for the protective film 21. Hereinafter, overlapping description with the first embodiment will be omitted, and the third embodiment will be described focusing on differences.

Figure 10:
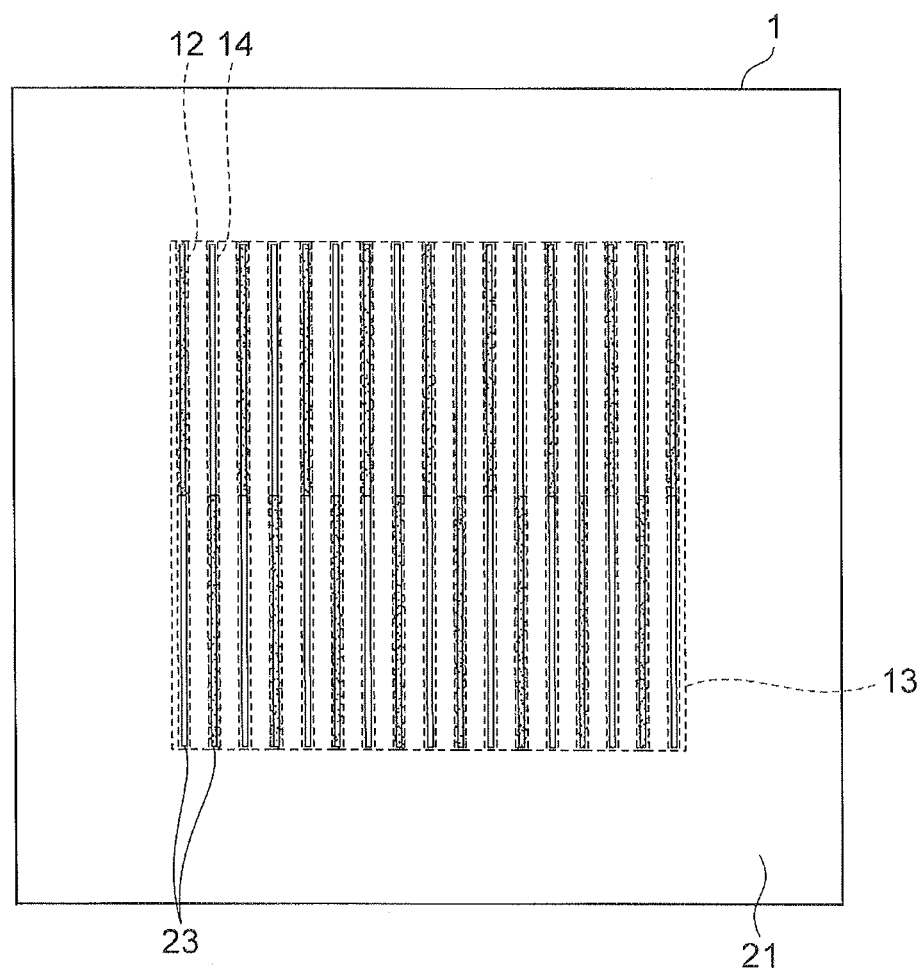
FIG. 10 is a view of a back-illuminated energy ray detecting element according to a third embodiment from a second principal surface side.

FIG. 10 is a view of the back-illuminated energy ray detecting element 1 according to the third embodiment from the second principal surface 11b side.

As shown in FIG. 10, the protective film 21 has the plurality of grooves 23 extending in the same direction. The protective film 21 has the plurality of grooves 23 at positions opposite to the charge generating region 13.

The plurality of grooves 23 extend in the second direction. As shown in FIG. 10, the plurality of grooves 23 are disposed so as to be opposed to the region between the two adjacent energy ray sensitive regions 131. The plurality of grooves 23 are disposed so as to be opposed to the excessive charge discharging region 12 or the pixel separating section 14. In the embodiment, the plurality of grooves 23 extend in a direction parallel to the pixel column of the pixel array, i.e., the second direction. For this reason, an effect of alleviating the stress from the plurality of grooves 23 in the first direction is obtained.

Further, the grooves 23 are disposed at a position opposite to the excessive charge discharging region 12 or the pixel separating section 14. A thickness of the protective film 21 opposite to the energy ray sensitive region 131 is a first thickness. A thickness of the protective film 21 opposite to the excessive charge discharging region 12 or the pixel separating section 14 is a second thickness. For this reason, reduction of the dark current and physical protection can be achieved by the protective film 21, and the stress generated in the protective film 21 can be further alleviated by the plurality of grooves 23.

The protective film 21 according to the third embodiment described above can achieve reduction of the dark current and physical protection, and the stress generated in the protective film 21 can be alleviated by the grooves 23.

(Fourth Embodiment)

A back-illuminated energy ray detecting element according to a fourth embodiment will be described with reference to FIG. 11. The back-illuminated energy ray detecting element 1 according to the fourth embodiment is the same as the back-illuminated energy ray detecting element 1 according to the first embodiment except for the protective film 21. Hereinafter, overlapping description with the first embodiment will be omitted, and the fourth embodiment will be described focusing on differences.

Figure 11:
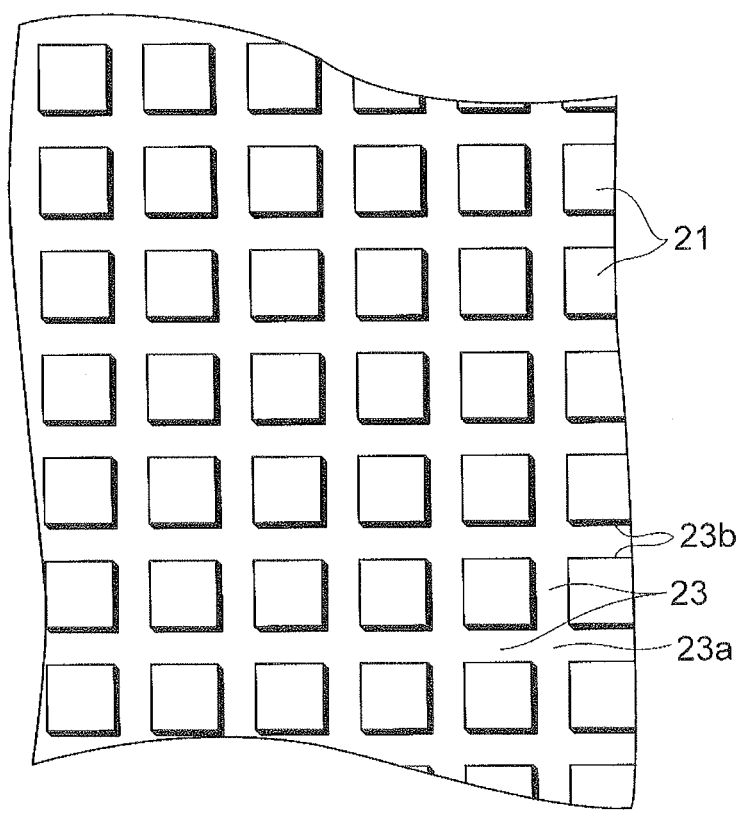
FIG. 11 is a view showing a protective film of a back-illuminated energy ray detecting element according to a fourth embodiment.

FIG. 11 is a partially enlarged view showing the protective film 21 of the back-illuminated energy ray detecting element 1 according to the fourth embodiment.

In the fourth embodiment, as shown in FIG. 11, the protective film 21 has the grooves 23 that is symmetrical with respect to the second direction in which the electric charges are transferred and the first direction.

As shown in FIG. 11, the protective film 21 has the plurality of grooves 23 extending in the first direction and the second direction. In the embodiment, the protective film 21 has the grooves 23 having a lattice shape. The plurality of grooves 23 extend in a direction parallel to the pixel column of the pixel array and a direction parallel to the pixel row of the pixel array, i.e., the plurality of grooves 23 extend in the lattice shape.

For this reason, a high stress alleviation effect is obtained by the plurality of grooves 23 in two directions in which the grooves 23 extend. Accordingly, as the protective film 21 has the plurality of grooves 23, stress of the protective film 21 is alleviated more easily and securely.

The protective film 21 according to the fourth embodiment described above can achieve reduction of dark current and physical protection in the back-illuminated energy ray detecting element 1, and stress generated in the protective film 21 can be alleviated by the grooves 23 in two directions in which the grooves 23 extend.

(Fifth Embodiment)

A back-illuminated energy ray detecting element according to a fifth embodiment will be described with reference to FIG. 12. The back-illuminated energy ray detecting element 1 according to the fifth embodiment is the same as the back-illuminated energy ray detecting element according to the first embodiment except for the protective film 21. Hereinafter, overlapping description with the first embodiment will be omitted, and the fifth embodiment will be described focusing on differences.

Figure 12:
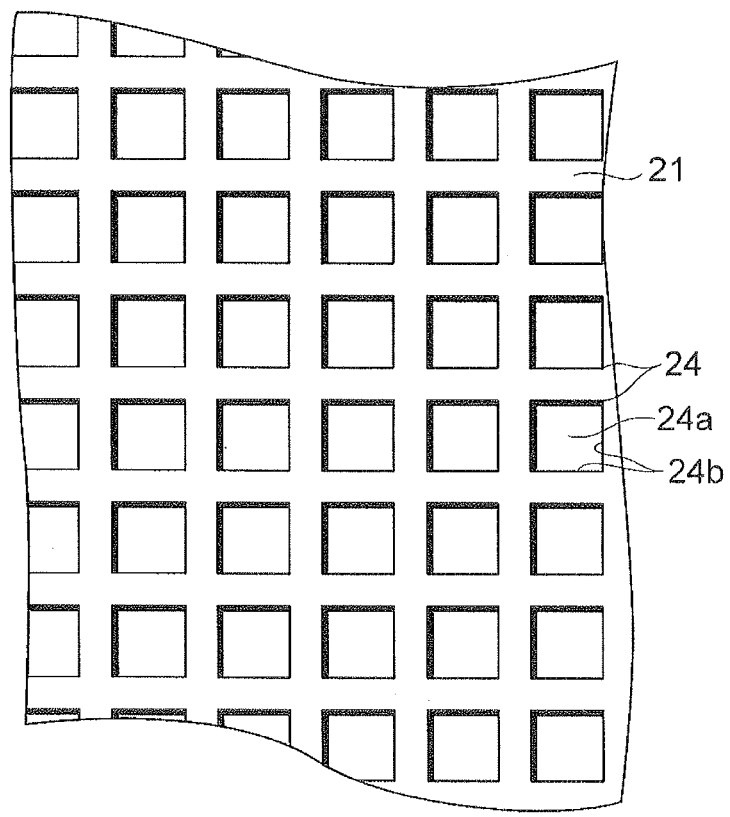
FIG. 12 is a view showing a protective film of a back-illuminated energy ray detecting element according to a fifth embodiment.

FIG. 12 is a partially enlarged view showing the protective film 21 of the back-illuminated energy ray detecting element according to the fifth embodiment.

In the fifth embodiment, as shown in FIG. 12, the protective film 21 has a plurality of recesses 24 disposed in a two-dimensional array. The protective film 21 has the recesses 24 parallel to the first direction and the second direction. The protective film 21 has the recesses 24 formed in the second direction in which the electric charges are transferred and the first direction, at substantially equal intervals.

The protective film 21 has the recesses 24 recessed in a thickness direction thereof. The protective film 21 has a bottom surface 24a formed in a direction substantially perpendicular to the thickness direction of the protective film 21. The protective film 21 has inner surfaces 24b formed in a direction substantially parallel to the thickness direction of the protective film 21. The recesses 24 is formed in the protective film 21 by the bottom surface 24a and the inner surfaces 24b. In the embodiment, a thickness between the second principal surface 11b and the bottom surface 24a is referred to as a second thickness. The first thickness is larger than the second thickness.

A cross section of the protective film 21 in a direction perpendicular to the thickness direction of the protective film 21 has a rectangular shape constituted by four inner surfaces 24b. The cross section is not limited to the rectangular shape but may have, for example, a polygonal shape, an oval shape, or a circular shape.

In the recesses 24, areas of the bottom surfaces 24a with respect to the pixels of the energy ray sensitive region 131 may be substantially equal to each other. In this case, reduction effects of the dark current with respect to the pixels are substantially equal to each other, For this reason, a high stress alleviation effect is obtained by the plurality of recesses 24 in directions in which the recesses 24 are disposed.

The protective film 21 according to the fifth embodiment described above can achieve reduction of the dark current and physical protection, and as the protective film 21 has the plurality of recesses 24, stress of the protective film 21 can be alleviated more easily and securely.

(Sixth Embodiment)

A back-illuminated energy ray detecting element according to a sixth embodiment will be described with reference to FIG. 13. The back-illuminated energy ray detecting element 1 according to the sixth embodiment is substantially the same as the back-illuminated energy ray detecting element according to the first embodiment except for the protective film 21. Hereinafter, overlapping description with the first embodiment will be omitted, and the sixth embodiment will be described focusing on differences.

Figure 13:
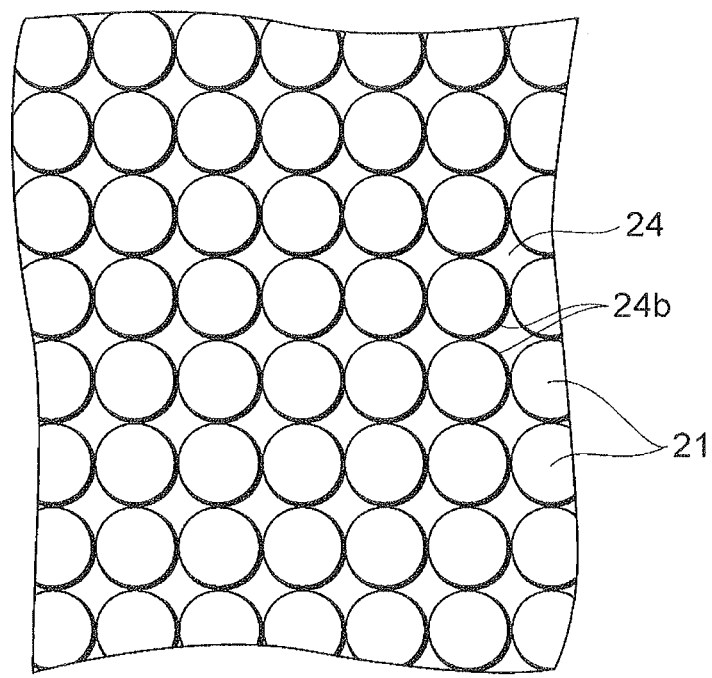
FIG. 13 is a view showing a protective film of a back-illuminated energy ray detecting element according to a sixth embodiment.

FIG. 13 is a partially enlarged view showing the protective film 21 of the back-illuminated energy ray detecting element 1 according to the sixth embodiment.

As shown in FIG. 13, the protective film 21 has the plurality of recesses 24 disposed in a two-dimensional array. In the embodiment, the recesses 24 may be provided in parallel to the first direction and the second direction, and at least a portion of the protective film 21 may have a substantially circular cross section parallel to the second principal surface 11b. This cross section may have an oval shape. When the cross-sectional shape is the substantially circular shape, in comparison with the case in which the cross-sectional shape is a polygonal shape, stress concentration is further avoided. For this reason, in the directions in which the recesses 24 are disposed, a high stress alleviation effect can be obtained.

The protective film 21 according to the sixth embodiment described above can achieve reduction of the dark current and physical protection, and as the protective film 21 has the recesses 24, stress of the protective film 21 can be alleviated more easily and securely. In comparison with the case in which a cross-sectional shape of the recess 24 of the cross section parallel to the protective film 21 is a polygonal shape, the stress can be further alleviated.

(Seventh Embodiment)

A back-illuminated energy ray detecting element according to a seventh embodiment will be described with reference to FIG. 14. The back-illuminated energy ray detecting element 1 according to the seventh embodiment is the same as the back-illuminated energy ray detecting element 1 according to the first embodiment except for the protective film 21. Hereinafter, overlapping description with the first embodiment will be omitted, and the seventh embodiment will be described focusing on differences.

Figure 14:
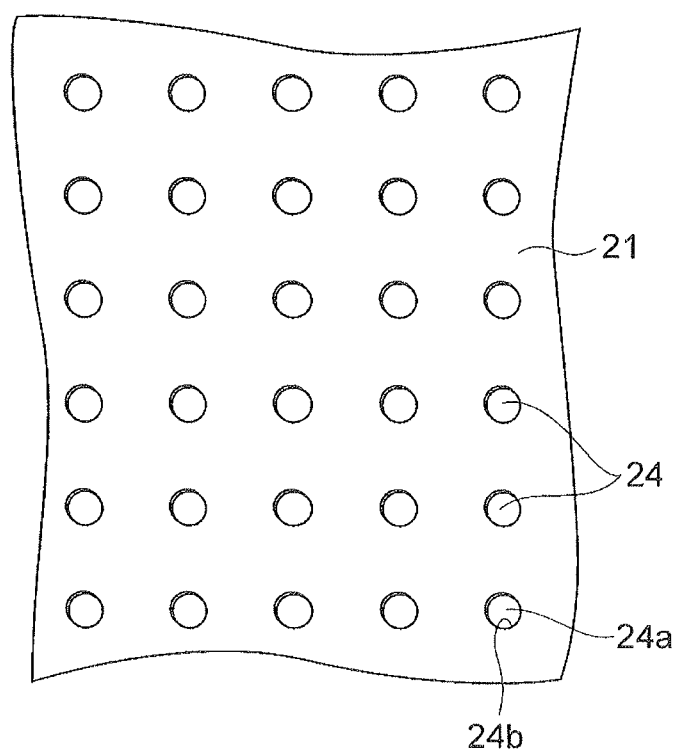
FIG. 14 is a view showing a protective film of a back-illuminated energy ray detecting element according to a seventh embodiment.

FIG. 14 is a partially enlarged view showing the protective film 21 of the back-illuminated energy ray detecting element 1 according to the seventh embodiment.

As shown in FIG. 14, the protective film 21 has the plurality of recesses 24 disposed in a two-dimensional array. The protective film 21 has the recesses 24 at positions opposite to the pixels of the charge generating region 13. The protective film 21 has the plurality of recesses 24 disposed in a two-dimensional array such as a grid pattern or the like. In the embodiment, a cross-sectional shape of a cross section parallel to the bottom surface 24a of the recess 24, i.e., the second principal surface 11b, is a circular shape. The cross-sectional shape or a shape of the bottom surface 24a may be an oval shape. When the cross-sectional shape is a substantially oval shape, stress concentration is further avoided in comparison with the case in which the cross-sectional shape is a polygonal shape. For this reason, a high stress alleviation effect is obtained in the directions in which the recesses 24 are disposed.

The protective film 21 according to the seventh embodiment described above can achieve reduction of the dark current and physical protection. As the protective film 21 has the recesses 24, stress of the protective film 21 is alleviated more easily and securely. The stress can be further alleviated in comparison with the case in which the cross-sectional shape of the recesses 24 of the cross section parallel to the protective film 21 is a polygonal shape.

(Eighth Embodiment)

A back-illuminated energy ray detecting element according to an eighth embodiment will be described with reference to FIG. 15. The back-illuminated energy ray detecting element 1 according to the eighth embodiment is the same as the back-illuminated energy ray detecting element 1 according to the first embodiment except for the protective film 21. Hereinafter, overlapping description with the first embodiment will be omitted, and the eighth embodiment will be described focusing on differences.

Figure 15:
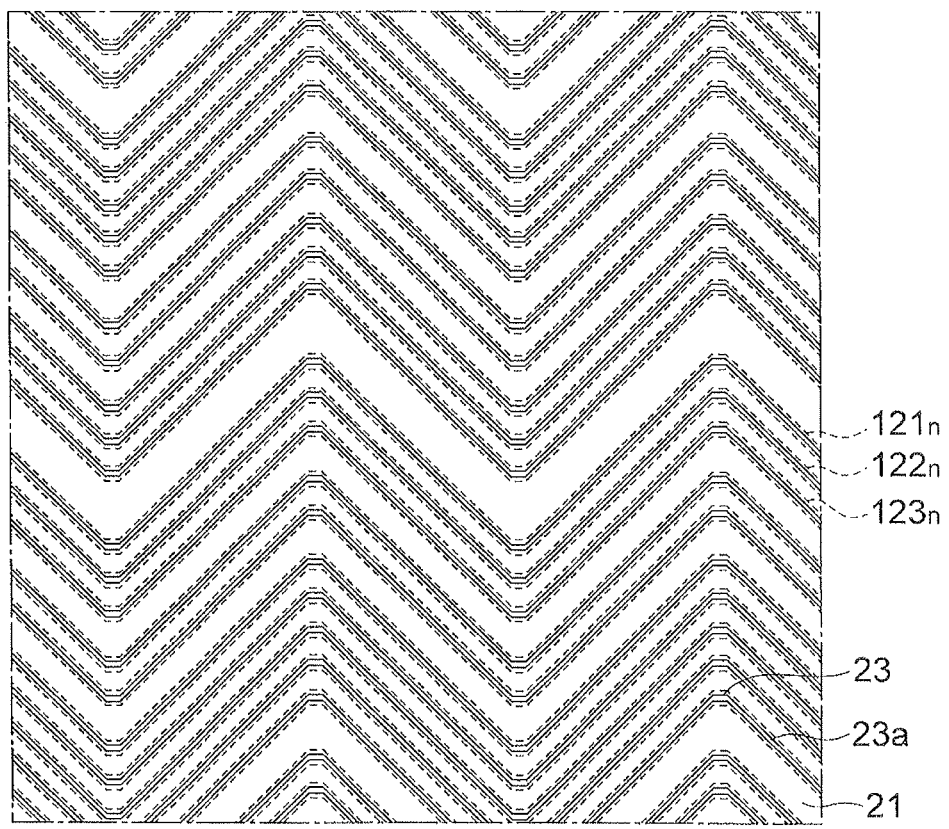
FIG. 15 is a view showing a protective film of a back-illuminated energy ray detecting element according to an eighth embodiment.

FIG. 15 is a partially enlarged view showing the protective film 21 of the back-illuminated energy ray detecting element 1 according to the eighth embodiment.

As shown in FIG. 15, the protective film 21 has the plurality of grooves 23. in the embodiment, the plurality of grooves 23 are disposed on the auxiliary wirings 121n to 123n of the charge generating region 13. Since the auxiliary wirings 121n to 123n extend in the direction crossing the first direction and the second direction, the plurality of grooves 23 extend in the direction crossing the first direction and the second direction. For this reason, stress generated in the protective film 21 can be alleviated in the first direction and the second direction. Further, since the plurality of grooves are parallel to the direction in which the electric charges are transferred, i.e., the second direction, a variation in a reduction effect of the dark current between a plurality of energy ray sensitive regions is suppressed.

Hydrogen is likely to be trapped by the wirings in the region in which the auxiliary wirings 121n to 123n are disposed. The hydrogen trapped in the region in which the auxiliary wirings 121n to 123n are disposed contributes to reduction of the dark current. For this reason, the dark current is not as easily generated as in the region between the two adjacent wirings. Accordingly, the stress generated in the protective film 21 can be alleviated without impeding the reduction effect of the dark current.

According to the eighth embodiment described above, the back-illuminated energy ray detecting element 1 can perform reduction of the dark current and physical protection using the protective film 21. As the protective film 21 has the plurality of grooves 23, stress of the protective film 21 can be alleviated more easily and securely.

(Ninth Embodiment)

A back-illuminated energy ray detecting element according to a ninth embodiment will be described with reference to FIG. 16. The back-illuminated energy ray detecting element 1 according to the ninth embodiment is the same as the back-illuminated energy ray detecting element according to the first embodiment except for the protective film 21. Hereinafter, overlapping description with the first embodiment will be omitted, and the ninth embodiment will be described focusing on differences.

Figure 16:
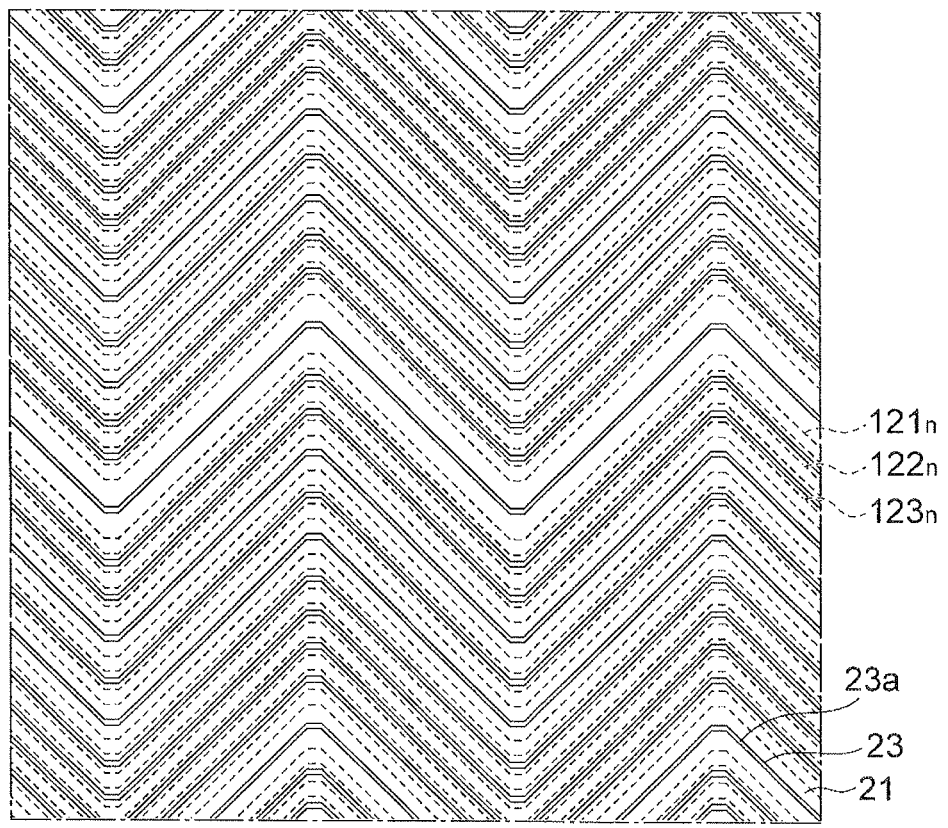
FIG. 16 is a view showing a protective film of a back-illuminated energy ray detecting element according to a ninth embodiment.

FIG. 16 is a partially enlarged view showing the protective film 21 of the back-illuminated energy ray detecting element 1 according to the ninth embodiment.

As shown in FIG. 16, the protective film 21 has the plurality of grooves 23. In the embodiment, the plurality of grooves 23 are disposed on the region between the two adjacent wirings of the auxiliary wirings 121n to 123n of the charge generating region 13. The region between the two adjacent wires is, for example, a region between an auxiliary wiring 121n and an auxiliary wiring 122n of FIG. 4. Since the auxiliary wirings 121n to 123n extend in the direction crossing the first direction and the second direction, the plurality of grooves 23 also extend in the direction crossing the first direction and the second direction. For this reason, stress generated in the protective film 21 can be alleviated in the first direction and the second direction. Further, since the plurality of grooves are disposed in parallel to the direction (the second direction) in which the electric charges are transferred, a variation in a reduction effect of the dark current between the plurality of energy ray sensitive regions is suppressed.

The protective film 21 according to the ninth embodiment described above can achieve reduction of the dark current and physical protection. As the protective film 21 has the plurality of grooves 23, stress of the protective film 21 can be alleviated more easily and securely. Further, since the wiring of the charge transfer section 132 is securely protected by the protective film 21, occurrence of short circuit or disconnection of the wiring is suppressed. For this reason, a yield rate is improved, and thus quality of products is improved.

Embodiments of the present invention have been described above. The present invention is not limited to the above-mentioned embodiments but various modifications may be made without departing from the spirit of the present invention.

Figure 7:
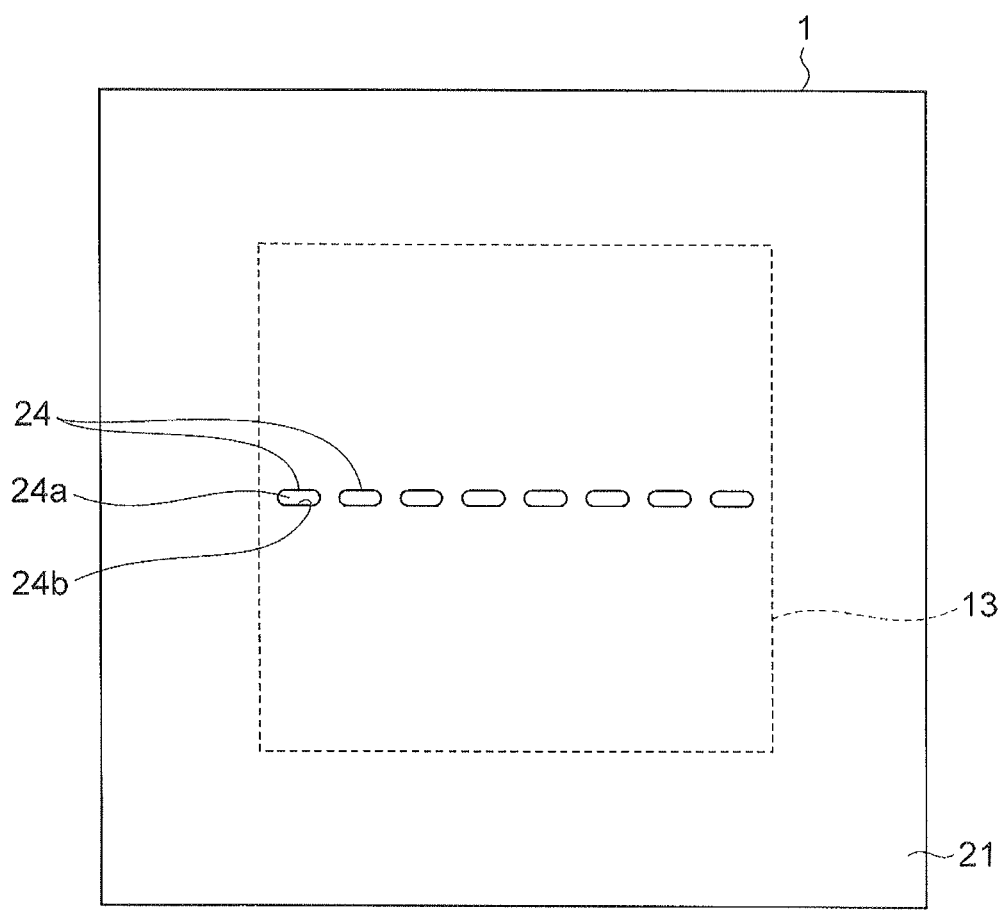
FIG. 7 is a view of a back-illuminated energy ray detecting element according to a modification example of the first embodiment from a second principal surface side.

In the above-mentioned first embodiment, second embodiment, third embodiment, fourth embodiment, eighth embodiment, and ninth embodiment, while examples in which the groove 23 functions as a stress alleviating section were described, examples are not limited thereto. A recess may be applied as the stress alleviating section instead of the groove 23. For example, as shown in FIG. 7, the recess 24 instead of the groove 23 may be applied as the stress alleviating section of the first embodiment. When the protective film 21 includes at least one recess 24, reduction of the dark current and physical protection can be achieved. Stress generated in the protective film 21 can be alleviated by the recess 24.

In the above-mentioned second embodiment, third embodiment, fourth embodiment, eighth embodiment, and ninth embodiment, while examples in which the plurality of grooves 23 function as the stress alleviating section were described, examples are not limited thereto. First thicknesses of the plurality of grooves 23 included in the protective film 21 may be different from each other in the grooves 23.

In the above-mentioned fifth embodiment, sixth embodiment, and seventh embodiment, while examples in which the plurality of recesses 24 function as the stress alleviating section were described, examples are not limited thereto. First thicknesses of the plurality of recesses 24 included in the protective film 21 may be different from each other in the recesses 24.

In the above-mentioned first embodiment, second embodiment, third embodiment, and fourth embodiment, while cases in which the groove 23 or the recess 24 serving as the stress alleviating section is disposed on the protective film 21 opposite to the charge generating region 13 was described, cases are not limited thereto. For example, the grooves 23 or the recesses 24 may be disposed on the entire protective film 21.

In the above-mentioned embodiments, while the case in which the protective film 21 has any one of the groove 23 and the recess 24 were described, cases are not limited thereto. The protective film 21 may have the groove 23 and the recess 24 serving as the stress alleviating section. In this case, the protective film 21 may include the recess 24 formed at the region of the protective film 21 including no groove 23.

Figure 17:
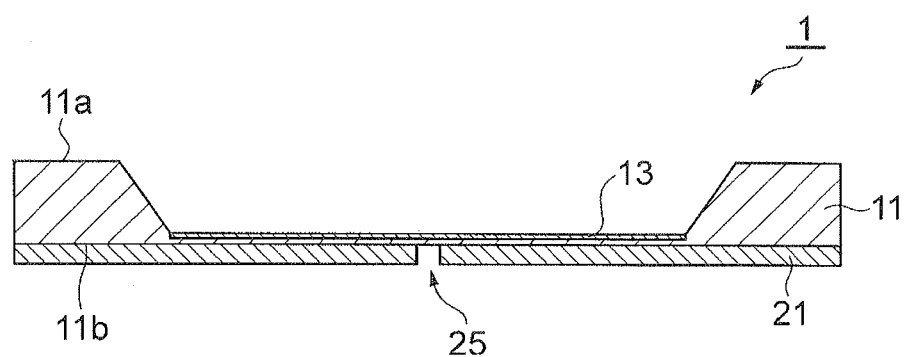
FIG. 17 is a view for describing a cross-sectional configuration of a back-illuminated energy ray detecting element.

In the above-mentioned embodiments, while an example in which the groove 23 having the bottom surface 23a or the recess 24 having the bottom surface 24a functions as the stress alleviating section has been described, examples are not limited thereto. The groove 23 may not have the bottom surface 23a, and the recess 24 may not have the bottom surface 24a. The groove 23 may be a bottomless groove recessed in the thickness direction thereof. The recess 24 may be a bottomless recess recessed in the thickness direction thereof. As shown in FIG. 17, when the protective film 21 includes a groove 25, the groove 25 functions as the stress alleviating section. Accordingly, when the groove is a bottomed groove or the groove is a bottomless groove, stress generated in the protective film is securely alleviated by a relatively simple configuration. In view of reducing the dark current and providing physically protection, the stress alleviating section may be the bottomed recess.

In the above-mentioned embodiment, areas of the grooves 23 and 25 or the recess 24 with respect to the pixels may be substantially equal to each other between the pixels. In this case, the reduction effect of the dark current is substantially uniform with respect to the energy ray sensitive region 131. The variation in the reduction effect of the dark current is not as easily generated. For example, in the first embodiment, when a sum of the areas of the bottom surfaces 23a is substantially equal between the pixels, since the reduction effect of the dark current between the pixels is substantially uniform, the variation in the reduction effect of the dark current is not as easily generated.

In the above-mentioned embodiments, while the full-frame transfer (FFT) CCD has been exemplarily described as a method of transferring the electric charges generated in the charge generating region 13, a method of transferring the electric charges generated in the charge generating region 13 may be, for example, another CCD such as a frame transfer (FT), an interline transfer (IT), or the like. When the method of transferring the electric charges is the FT-CCD, as the vertical shift register is divided into two upper and lower regions, a charge generating region (the upper region) and an accumulating section (the lower region) are formed. The method of transferring the electric charges generated in the charge generating region 13 is not limited to the CCD.

INDUSTRIAL APPLICABILITY

The present invention may be used in an energy ray detecting element and an energy ray detecting apparatus for detecting an energy ray.

REFERENCE SIGNS LIST

1 . . . back-illuminated energy ray detecting element, 11 . . . semiconductor substrate, 11a . . . first principal surface, 11b . . . second principal surface, 13 . . . charge generating region, 21 . . . protective film, 23 . . . groove (stress alleviating section), 24 . . . recess (stress alleviating section), 121n-123n, 130n . . . wiring, 131 . . . energy ray sensitive region, 132 . . . charge transfer section.

The invention claimed is:

1. A back-illuminated energy ray detecting element comprising:
   a semiconductor substrate having a first principal surface arranged to constitute an energy ray incident surface and a second principal surface opposite to the first principal surface, and in which a charge generating region configured to generate an electric charge in accordance with incidence of an energy ray from the first principal surface is provided on the second principal surface side, the second principal surface being arranged not to constitute an energy ray incident surface;
   a charge transfer section disposed as to be opposed to the charge generating region, and configured to transfer the electric charges generated in the charge generating region; and
   a protective film provided on the second principal surface side to cover at least the charge generating region, and including silicon nitride or silicon nitride oxide,
   wherein the charge generating region includes a plurality of pixels being two dimensionally arranged,
   the protective film has a stress alleviating section configured to alleviate stress generated in the protective film, and
   the energy ray detecting element constitutes a back-illuminated energy ray detective element.

2. The energy ray detecting element according to claim 1, wherein the stress alleviating section is a bottomed or bottomless recess recessed in a thickness direction of the protective film.

3. The energy ray detecting element according to claim 2, wherein the recess is a groove extending in a direction parallel to the second principal surface.

4. The energy ray detecting element according to claim 3, wherein a plurality of said grooves extending in the same direction are provided as the stress alleviating section.

5. The energy ray detecting element according to claim 4, wherein the charge generating region has a plurality of energy ray sensitive regions juxtaposed in a first direction,
   the charge transfer section is configured to transfer the electric charges generated in the energy ray sensitive regions in a second direction perpendicular to the first direction, and
   the plurality of grooves extend in a direction along the first direction.

6. The energy ray detecting element according to claim 4, wherein the charge generating region has a plurality of energy ray sensitive regions juxtaposed in a first direction,
   the charge transfer section is configured to transfer the electric charges generated in the energy ray sensitive regions in a second direction perpendicular to the first direction, and
   the plurality of grooves extend in a direction along the second direction.

7. The energy ray detecting element according to claim 6, wherein the plurality of grooves are disposed to correspond to a region between the two adjacent energy ray sensitive regions.

8. The energy ray detecting element according to claim 2, wherein the recess is a lattice-shaped groove.

9. The energy ray detecting element according to claim 2, wherein the plurality of said recesses disposed in a two-dimensional array are provided as the stress alleviating section.

10. The energy ray detecting element according to claim 4,
    wherein the charge generating region has a plurality of energy ray sensitive regions juxtaposed in a first direction,
    the charge transfer section is configured to transfer the electric charges generated in the energy ray sensitive regions in a second direction perpendicular to the first direction,
    the charge transfer section has a plurality of wirings extending in a direction crossing the first direction and the second direction, and disposed at intervals, and
    the plurality of grooves are disposed on the plurality of wirings.

11. The energy ray detecting element according to claim 4,
    wherein the charge generating region has a plurality of energy ray sensitive regions juxtaposed in a first direction,
    the charge transfer section is configured to transfer the electric charges generated in the energy ray sensitive regions in a second direction perpendicular to the first direction,
    the charge transfer section has a plurality of wirings extending in a direction crossing the first direction and the second direction, and disposed at intervals, and
    each of the grooves is disposed on a region between the two adjacent wirings.

12. The energy ray detecting element according to claim 1, wherein the protective film constitutes an outermost layer.

* * * * *